US011894536B2

(12) United States Patent
Yun

(10) Patent No.: US 11,894,536 B2
(45) Date of Patent: *Feb. 6, 2024

(54) BATTERY MODULE, BATTERY PACK COMPRISING BATTERY MODULE AND VEHICLE COMPRISING BATTERY PACK

(71) Applicant: LG Energy Solution, Ltd., Seoul (KR)

(72) Inventor: Hyeon-Ki Yun, Daejeon (KR)

(73) Assignee: LG Energy Solution, Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 17/723,943

(22) Filed: Apr. 19, 2022

(65) Prior Publication Data

US 2022/0247004 A1 Aug. 4, 2022

Related U.S. Application Data

(63) Continuation of application No. 16/625,415, filed as application No. PCT/KR2019/001999 on Feb. 19, 2019, now Pat. No. 11,342,607.

(30) Foreign Application Priority Data

Mar. 13, 2018 (KR) ........................ 10-2018-0029211

(51) Int. Cl.
*H01M 10/00* (2006.01)
*H01M 10/653* (2014.01)
(Continued)

(52) U.S. Cl.
CPC ....... *H01M 10/653* (2015.04); *H01M 10/425* (2013.01); *H01M 10/48* (2013.01);
(Continued)

(58) Field of Classification Search
CPC .. H01M 10/653; H01M 50/502; H01M 50/20; H01M 10/425; H01M 10/482;
(Continued)

(56) References Cited

U.S. PATENT DOCUMENTS 7,892,669 B2 * 2/2011 Yang .................... H01M 50/557
429/96
11,342,607 B2 * 5/2022 Yun .................... H01M 10/4257
(Continued)

FOREIGN PATENT DOCUMENTS

| EP | 3264493 A1 | 1/2018 |
|----|-----------|--------|
| EP | 3291334 A1 | 3/2018 |

(Continued)

OTHER PUBLICATIONS

Extended European Search Report for EP Application No. 19767340.3 dated Nov. 3, 2021.
International Search Report for Application No. PCT/KR2019/001999 dated May 16, 2019.

*Primary Examiner* — Nicholas P D'Aniello
(74) *Attorney, Agent, or Firm* — Lerner David LLP

(57) ABSTRACT

A battery module includes a battery cell assembly having a plurality of battery cells, a sensing assembly which covers a front and rear of the battery cell assembly when mounted thereto, a module case which receives the battery cell assembly and the mounted sensing assembly, and a thermally conductive adhesive interposed between an upper inner surface of the module case and an upper side of the battery cell assembly. The sensing assembly includes a first busbar frame assembly positioned at the front of the battery cell assembly, a second busbar frame assembly positioned at the rear of the battery cell assembly, and a sensing wire which connects the first and second busbar frame assemblies and runs across the upper side of the battery cell assembly in a diagonal direction. The thermally conductive adhesive is disposed on two sides of the sensing wire.

19 Claims, 18 Drawing Sheets

(51) Int. Cl.
*H01M 10/42* (2006.01)
*H01M 10/48* (2006.01)
*H05K 1/11* (2006.01)
*H01M 50/293* (2021.01)
*H01M 50/287* (2021.01)
*H01M 50/298* (2021.01)
*H01M 50/211* (2021.01)
*H01M 50/569* (2021.01)
*H01M 50/507* (2021.01)
*H01M 50/519* (2021.01)

(52) U.S. Cl.
CPC ....... *H01M 10/482* (2013.01); *H01M 10/486* (2013.01); *H01M 50/211* (2021.01); *H01M 50/287* (2021.01); *H01M 50/293* (2021.01); *H01M 50/298* (2021.01); *H01M 50/507* (2021.01); *H01M 50/519* (2021.01); *H01M 50/569* (2021.01); *H05K 1/118* (2013.01); *H01M 2220/20* (2013.01)

(58) Field of Classification Search
CPC ........... H01M 2220/20; H01M 10/625; H01M 10/647; H01M 10/4257; H01M 10/486; H01M 50/50; H01M 10/613; H01M 10/48; H01M 10/42; H05K 1/118; Y02E 60/10
See application file for complete search history.

(56) References Cited

U.S. PATENT DOCUMENTS

| | | | |
|---|---|---|---|
| 2008/0057393 A1* | 3/2008 | Onuki | H01M 10/0481 429/159 |
| 2008/0292910 A1* | 11/2008 | Tsai | H01M 10/6563 429/1 |
| 2013/0337299 A1* | 12/2013 | Sugawara | H01M 10/482 429/61 |
| 2016/0013460 A1 | 1/2016 | Fukunaga et al. | |
| 2016/0233465 A1 | 8/2016 | Lee et al. | |
| 2016/0374200 A1 | 12/2016 | Lee et al. | |
| 2017/0069897 A1 | 3/2017 | Lee | |
| 2018/0019508 A1 | 1/2018 | Lee et al. | |
| 2018/0076493 A1 | 3/2018 | Park et al. | |

FOREIGN PATENT DOCUMENTS

| | | |
|---|---|---|
| JP | 2009295381 A | 12/2009 |
| KR | 20140072689 A | 6/2014 |
| KR | 20140077811 A | 6/2014 |
| KR | 101615928 B1 | 4/2016 |
| KR | 20160115582 A | 10/2016 |
| KR | 20170022741 A | 3/2017 |
| KR | 20170094981 A | 8/2017 |
| KR | 101792675 B1 | 10/2017 |
| KR | 20170138200 A | 12/2017 |
| KR | 101829350 B1 | 2/2018 |
| WO | 2016137303 A1 | 9/2016 |

* cited by examiner

BATTERY MODULE, BATTERY PACK COMPRISING BATTERY MODULE AND VEHICLE COMPRISING BATTERY PACK

CROSS-REFERENCE TO RELATED APPLICATIONS

This application is a continuation of U.S. application Ser. No. 16/625,415, filed on Dec. 20, 2019, which is a national phase entry under 35 U.S.C. § 371 of International Application No. PCT/KR2019/001999 filed Feb. 19, 2019, which claims priority from Korean Patent Application No. 10-2018-0029211, filed on Mar. 13, 2018, the disclosures of which are incorporated herein by reference.

TECHNICAL FIELD

The present disclosure relates to a battery module, a battery pack comprising the battery module and a vehicle comprising the battery pack.

BACKGROUND ART

Due to their frequent applicability to various products and their electrical properties such as a high energy density, secondary batteries are not only commonly applied to portable devices, but universally applied to Electric Vehicles (EVs) or Hybrid Electric Vehicles (HEVs) that are driven by an electric driving source. Secondary batteries are gaining attention for their primary advantage of remarkably reducing the use of fossil fuels and not generating by-products from the use of energy, making them a new eco-friendly and energy efficient source of energy.

Currently, commonly used secondary batteries include lithium ion batteries, lithium polymer batteries, nickel cadmium batteries, nickel hydrogen batteries and nickel zinc batteries. A unit secondary battery cell, or a unit battery cell, has a working voltage of about 2.5V-4.5V. Accordingly, in cases where higher output voltage is required, a plurality of battery cells may be connected in series to form a battery pack. Additionally, a battery pack may be formed by connecting a plurality of battery cells in parallel based on the charge/discharge capacity required for the battery pack. Accordingly, the number of battery cells included in the battery pack may be variously set based on the output voltage or charge/discharge capacity required.

Meanwhile, in cases where a battery pack is formed by connecting battery cells in series/in parallel, it is common to form a battery pack by forming a battery module including at least one battery cell and then adding other components using at least one battery module.

In the case of the conventional battery module, with the increasing battery capacity required, the importance of technology for efficiently cooling heat generated from the battery cell is gradually increasing.

For efficient cooling, the conventional battery module introduces a structure in which a thermally conductive adhesive is applied onto the lower inner surface of a module case or the upper side of a cooling plate to stably fix a battery cell assembly including at least one battery cell to the lower inner surface of the module case or the upper side of the cooling plate and improve thermal conductivity.

However, in the conventional battery module, the location for applying the thermally conductive adhesive is limited to the lower inner surface of the module case or the upper side of the cooling plate. Because a separate component such as a voltage sensing line is disposed on the battery cell assembly, it is difficult to uniformly apply the thermally conductive adhesive over the entire battery cell assembly near the component. Accordingly, conventionally, there is a limitation that the only cooling structure that is possible is through the lower side of the battery cell assembly, which makes it impossible to design devices using the battery module or respond to design changes, and when cooling performance through the lower side of the battery cell assembly is insufficient, it is difficult to improve the cooling performance.

DISCLOSURE

Technical Problem

Accordingly, the present disclosure is designed to solve the above-described problem, and the present disclosure is directed to providing a battery module that is cooled using a thermally conductive adhesive and allows a cooling structure through the upper side of the battery cell assembly, a battery pack comprising the battery module and a vehicle comprising the battery pack.

These and other objects and advantages of the present disclosure will be understood by the following description and will be apparent from the embodiments of the present disclosure. Further, it will be readily understood that the objects and advantages of the present disclosure are realized by the means set forth in the appended claims and combinations thereof.

Technical Solution

To solve the above-described problem, the present disclosure provides a battery module including a battery cell assembly including a plurality of battery cells, a sensing assembly which covers the front and rear of the battery cell assembly, a module case which receives the battery cell assembly having the sensing assembly mounted thereto, and a thermally conductive adhesive interposed between an upper inner surface of the module case and an upper side of the battery cell assembly. The sensing assembly includes a first busbar frame assembly positioned in front of the battery cell assembly, a second busbar frame assembly positioned at the rear of the battery cell assembly, facing the first busbar frame assembly, and a sensing wire which connects the first and second busbar frame assemblies and runs across the upper side of the battery cell assembly in a diagonal direction. The thermally conductive adhesive is disposed on two sides of the sensing wire.

The module case may further include a top plate which covers the upper side of the battery cell assembly, a bottom plate which is positioned facing the top plate, and covers a lower side of the battery cell assembly, a pair of side plates which are coupled to the top plate and the bottom plate and are positioned on two sides of the battery cell assembly, a first opening and a second opening which are open to two lengthwise direction sides of the battery cells, a front cover which is coupled to the first opening of the module case and covers the front of the battery cell assembly, and a rear cover which is coupled to the second opening of the module case and covers the rear of the battery cell assembly.

The sensing wire may be provided as a flexible printed circuit board (FPCB). In this instance, the battery module may further include a top cover which covers the flexible printed circuit board. The top cover may have a hook at each of two ends, the first busbar frame assembly and the second busbar frame assembly may have fixing holes for insertion of the hooks, and the hooks may be coupled to the fixing holes.

The battery module may further include injection holes on the module case to inject the thermally conductive adhesive into the module case, the injection holes being provided on two sides of an area corresponding to the sensing wire. In this instance, the injection holes may be a plurality of injection holes provided in parallel along a direction which forms an angle of 0 to 30° with a direction in which the sensing wire runs.

The injection holes may have a sloped chamfer on one side.

The present disclosure further provides a battery pack including at least one battery module according to the present disclosure, and a pack case which packages the at least one battery module.

The present disclosure further provides a vehicle including at least one battery pack according to the present disclosure.

Advantageous Effects

According to an aspect of the present disclosure, there is provided a battery module using a tubular rectangular monoframe type module case, not a conventional cell cartridge. Due to not using a conventional cell cartridge to which the edge of the battery cell is inserted and fixed by press-fit as conventionally, the tolerance in the design of the entire battery module increases, and it is possible to solve the conventional problem with the transmission of impacts or vibration to the edge of the battery cell, which may occur during mounting when the edge of the battery cell is inserted into the cell cartridge. The battery module and the battery pack can protect the battery cell from external vibration very well, and thus they are advantageous in the application of vehicles that are frequently exposed to external vibration.

According to another aspect of the present disclosure, assembly of the battery module can be easily performed, resulting in high process efficiency. Additionally, the battery module may not include a sealing component such as an O-ring, a cooling component such as a cooling fin, or a reinforcing or fixing component such as a cartridge, thus reducing the number of components of the battery module. Accordingly, according to this aspect of the present disclosure, it is possible to reduce the production cost and time and the weight, thereby improving productivity of the battery module.

According to still another aspect of the present disclosure, it is possible to uniformly apply a thermally conductive adhesive over the entire upper side of the battery cell assembly. Accordingly, the cooling structure through the lower side and the upper side of the battery cell assembly is possible. According to the present disclosure, because cooling through the upper side of the battery cell assembly is possible, it is easy to design devices using the battery module or respond to design changes, and when cooling performance through the lower side of the battery cell assembly is insufficient, it is possible to improve the cooling performance.

According to yet another aspect of the present disclosure, because the thermally conductive adhesive is applied to the upper side of the battery cell assembly, it is possible to fix the battery cell to the module case more firmly, and firmly fix the position of the battery cell against impacts.

According to a further aspect of the present disclosure, in the battery module that is cooled using the thermally conductive adhesive, the thermally conductive adhesive injection efficiency can be increased.

As described above, the present disclosure can provide a simple and compact battery module that does not make the entire structure of the battery pack complex and does not occupy much space, and which achieves firm fixation between the battery cell and the module case, and which contributes to the cooling performance improvement. Further, the present disclosure can provide a battery pack comprising the battery module and a vehicle comprising the battery pack.

BRIEF DESCRIPTION OF DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

MODE FOR DISCLOSURE

Figure 1:
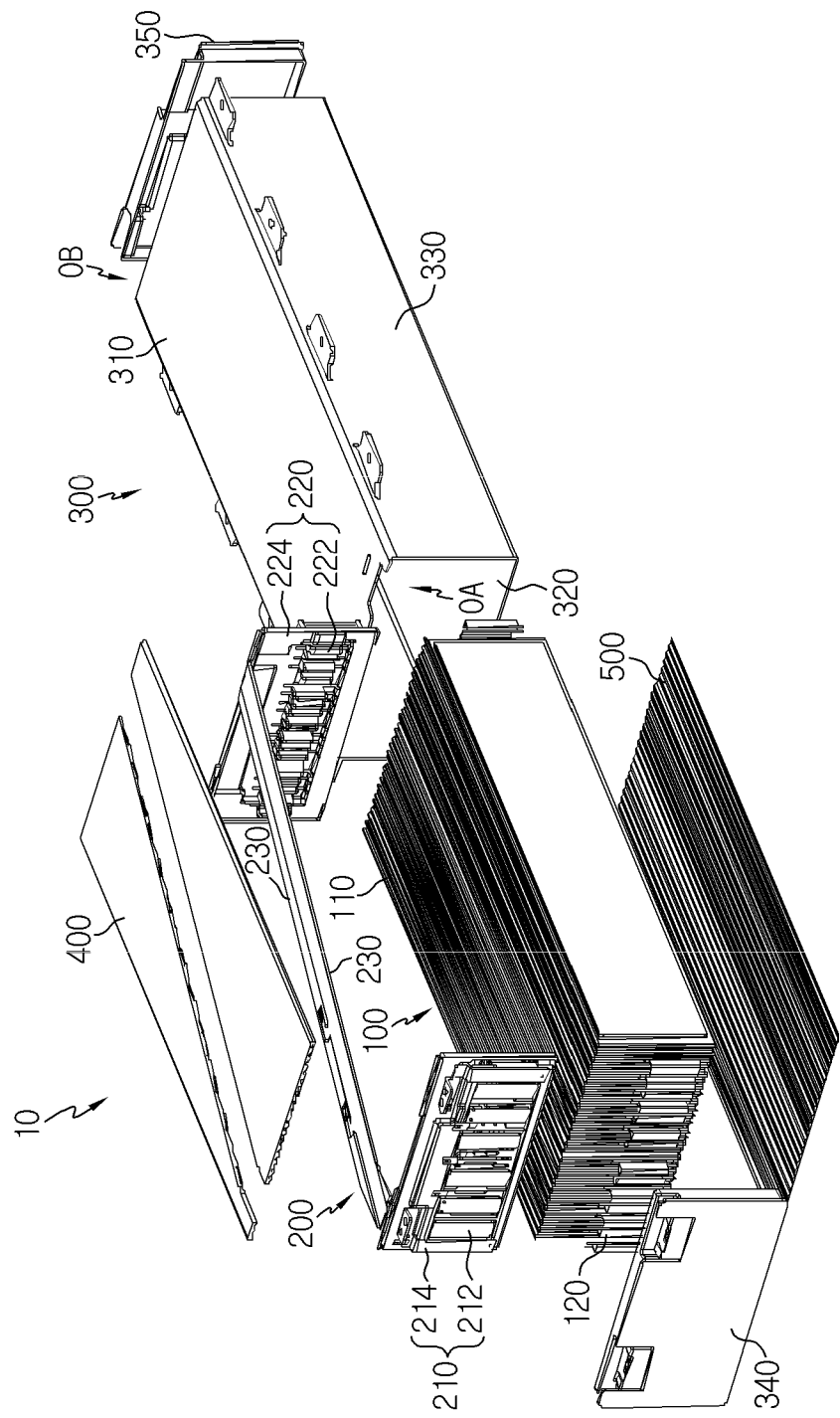
FIG. 1 is an exploded perspective view illustrating a battery module according to an embodiment of the present disclosure.

Hereinafter, the preferred embodiments of the present disclosure will be described in detail with reference to the accompanying drawings. Prior to the description, it should be understood that the terms or words used in the specification and the appended claims should not be construed as limited to general and dictionary meanings, but interpreted based on the meanings and concepts corresponding to the technical aspects of the present disclosure, on the basis of the principle that the inventor is allowed to define terms appropriately for the best explanation.

Therefore, the embodiments described herein and illustrations shown in the drawings are just a most preferred embodiment of the present disclosure, but not intended to fully describe the technical aspects of the present disclosure, so it should be understood that other equivalents and modifications could have been made thereto at the time the application was filed.

Figure 2:
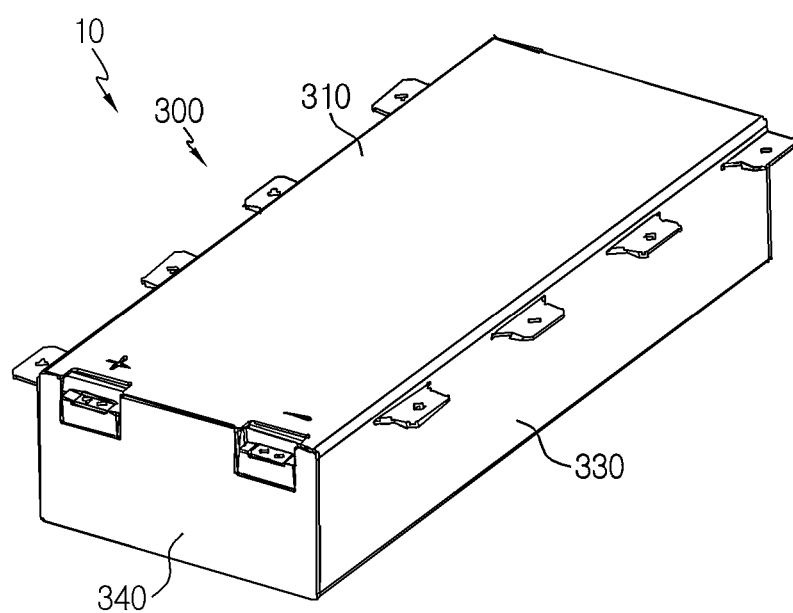
FIG. 2 is an assembled perspective view of FIG. 1.

FIG. 1 is an exploded perspective view illustrating a battery module according to an embodiment of the present disclosure, and FIG. 2 is an assembled perspective view of FIG. 1.

Referring to FIGS. 1 and 2, the battery module 10 may include a battery cell assembly 100, a sensing assembly 200, a module case 300 and thermally conductive adhesives 400, 500.

The battery cell assembly 100 may include a plurality of battery cells 110. The plurality of battery cells 110 may be stacked such that they may be electrically connected to one another. Here, electrode leads 120 of the plurality of battery cells 110 may be electrically connected to the sensing assembly 200.

The sensing assembly 200 covers the front and rear of the battery cell assembly 100. The sensing assembly 200 may be electrically connected to the battery cell assembly 100, and may sense the voltage or temperature of the battery cell assembly 100. Additionally, the sensing assembly 200 may be connected to an external power source.

The sensing assembly 200 serves to transmit sensing information of the electrical properties of the battery cell assembly 100 such as voltage to another device (not shown) outside of the battery module 10. For example, the battery module 10 may include a device such as a Battery Management System (BMS) connected thereto, and may be configured to control the operation of the battery module 10 such as charging or discharging. In this instance, the sensing assembly 200 may be connected to the BMS and provide the sensed voltage information of the battery cell assembly 100 to the BMS, and the BMS may control the battery module 10 based on the information.

The sensing assembly 200 includes a first busbar frame assembly 210 positioned in front of the battery cell assembly 100, a second busbar frame assembly 220 positioned at the rear of the battery cell assembly 100 facing the first busbar frame assembly 210, and a sensing wire 230 connecting the first busbar frame assembly 210 and the second busbar frame assembly 220, and running across the upper side of the battery cell assembly 100 in a diagonal direction.

The first busbar frame assembly 210 includes a busbar 212 and a frame 214. The second busbar frame assembly 220 also includes a busbar 222 and a frame 224.

The busbar frame assemblies 210, 220 of the sensing assembly 200 may be mounted in exposed parts of the electrode leads 120 of the plurality of battery cells 110 so that they may be electrically connected to the electrode leads 120 of the plurality of battery cells 110, and the battery module 10 of this embodiment includes pouch-type secondary batteries each having the positive electrode lead and the negative electrode lead protruding in two directions, and thus a pair of busbar frame assemblies 210, 220 are respectively mounted in front of and at the rear of the battery cell assembly 100.

Here, the busbar frame assemblies 210, 220 are detachably coupled to the corresponding sides of the battery cell assembly 100, and they are configured to cover the entire side of the battery cell assembly 100. When the busbar frame assemblies 210, 220 and the battery cell assembly 100 are coupled together, the battery cell assembly 100 may be integrally supported by the busbar frame assemblies 210, 220.

The module case 300 has an empty space inside. The module case 300 receives the battery cell assembly 100 having the mounted sensing assembly 200 therein. The module case 300 is provided with at least one surface being open, to insert the battery cell assembly 100 through the open part. The module case 300 may be provided in a rectangular cuboid shape on the whole. In an example, the module case 300 may be provided in the shape of a tubular rectangle with two opposing sides being open.

The module case 300 is made of a thermally conductive material and may serve to absorb heat of the battery cell assembly 100 and radiate the heat outward. The module case 300 may be made of metal. Because the metal has good thermal conductivity, the module case 300 may perform the heat radiation function in whole. For the material of the module case 300, all metals may be used, but when considering thermal conductivity, processing and cost, it is desirable to use SUS- or aluminum-based materials.

The module case 300 may include a top plate 310 that covers the upper side of the battery cell assembly 100. To this end, the top plate 310 may have a size and shape that can fully cover the upper side of the battery cell assembly 100. The module case 300 may include a bottom plate 320 that is positioned facing the top plate 310, and covers the lower side of the battery cell assembly 100. The bottom plate 320 may be provided in generally the same shape as the top plate 310, and may stably support the battery cell assembly 100. The module case 300 may include a pair of side plates 330 that are coupled to the top plate 310 and the bottom plate 320, and are positioned on two sides of the battery cell assembly 100. The pair of side plates 330 may have the same shape and size, facing each other.

The module case 300 includes the top plate 310, the bottom plate 320 and the side plates 330, forming a first opening OA and a second opening OB that are open to two sides of the battery cells 110 in a lengthwise direction. The top plate 310, the bottom plate 320 and the side plates 330 may be connected by welding. For example, the top plate 310, the bottom plate 320 and the side plates 330 may be welded on the sides by friction stir welding such that their ends do not overlap and their edges come into contact with each other. In another example, the top plate 310, the bottom plate 320 and the side plates 330 may be bonded to one other, may be integrally formed, or may be coupled together with a hinge structure. As described above, the module case 300 may be a monoframe.

The bottom plate 320 may further include a guide structure on the upper surface to insert and fix the battery cell assembly 100. The guide structure and the battery cells 110 may be coupled in a sliding manner. That is, part of the battery cells 110 may be inserted and coupled to the guide structure. For example, a sealing part of the battery cells 110 may be inserted into the guide structure. A plurality of guide structures may be provided in the form of grooves. The number of the guide structures may correspond to the number of the battery cells 110. When the battery cell 110 is inserted into the guide structure, it is possible to support the battery cell 110 more stably.

In the assembly process, the battery cell assembly 100 having the mounted sensing assembly 200 is received in the module case 300 through the first opening OA of the module case 300. In this instance, the thermally conductive adhesive 400 may be applied to the upper side of the battery cell assembly 100, and the other thermally conductive adhesive 500 may be applied to the lower side of the battery cell assembly 100, and then the battery cell assembly 100 may be received in the module case 300. In another embodiment as described below, after the assembly process is completed, a thermally conductive adhesive may be injected into the module case 300 to form the thermally conductive adhesives 400, 500.

After the battery cell assembly 100 is received in the module case 300, a front cover 340 is coupled to the first opening OA of the module case 300 and covers the front of the battery cell assembly 100. The front cover 340 may be coupled to the first busbar frame assembly 210. The front cover 340 may form the front side of the battery module 10. Additionally, after the battery cell assembly 100 is received in the module case 300, a rear cover 350 is coupled to the second opening OB of the module case 300 and covers the rear of the battery cell assembly 100. The rear cover 350 may be coupled to the second busbar frame assembly 220. The rear cover 350 may form the rear side of the battery module 10.

The front cover 340 and the rear cover 350 may be positioned in front of and at the rear of the top plate 310 and the bottom plate 320, and cover the front and rear of the battery cell assembly 100. The front cover 340 and the rear cover 350 may be welded or bonded to the module case 300. Alternatively, the front cover 340 and the rear cover 350 may be detachably coupled to the module case 300.

As described above, the battery module 10 uses the tubular rectangular monoframe type module case 300, not a conventional cell cartridge. Due to not using a conventional cell cartridge to which the edge of the battery cell is inserted and fixed by press-fit, the tolerance in the design of the entire battery module 10 increases, and it is possible to solve the conventional problem with the transmission of impacts or vibration to the edge of the battery cell, which may occur during mounting when the edge of the battery cell is inserted into the cell cartridge. The battery module 10 and the battery pack including the same can protect the battery cell from external vibration very well, and thus they are advantageous in the application of vehicles that are frequently exposed to external vibration.

Additionally, the battery module 10 is completed by receiving the battery cell assembly 100 through the opening of the module case 300, followed by a simple operation of closing the openings on two sides. As described above, assembly of the battery module 10 can be easily performed, resulting in high process efficiency. Additionally, the battery module 10 may not include a sealing component such as an O-ring, a cooling component such as a cooling fin, or a reinforcing or fixing component such as a cartridge, thus reducing the number of components of the battery module 10. Accordingly, it is possible to reduce the production cost and time and the weight, thereby improving productivity of the battery module 10.

The thermally conductive adhesive 400 is interposed between the upper inner surface of the module case 300, i.e., the bottom of the top plate 310 and the upper side of the battery cell assembly 100. The thermally conductive adhesive 400 is disposed on two sides of the sensing wire 230. There is no example of conventional art in which the thermally conductive adhesive is uniformly applied to an upper side of the battery cell assembly in which a separate component such as a voltage sensing line is disposed.

The thermally conductive adhesive 400 is a cooling adhesive that allows heat transfer, and may include thermal resin. The thermal resin is not limited to a particular type, but may be one of a thermally conductive silicone-based bond, a thermally conductive acrylic bond and a thermally conductive polyurethane bond.

In this embodiment, the additional thermally conductive adhesive 500 may be interposed between the lower inner surface of the module case 300, i.e., the upper surface of the bottom plate 320 and the lower side of the battery cell assembly 100.

As described above, the thermally conductive adhesive can be uniformly applied over the upper side of the battery cell assembly 100. Accordingly, the cooling structure through the lower side as well as the upper side of the battery cell assembly 100 is possible. According to the present disclosure, because cooling through the upper side of the battery cell assembly 100 is possible, it is easy to design devices using the battery module 10 or respond to design changes, and when cooling performance through the lower side of the battery cell assembly 100 is insufficient, it is possible to improve the cooling performance. In addition, because the thermally conductive adhesive 400 is applied to the upper side of the battery cell assembly 100, it is possible to fix the battery cells 110 to the module case 300 more firmly, and firmly fix the position of the battery cells 110 against impacts.

Figure 3:
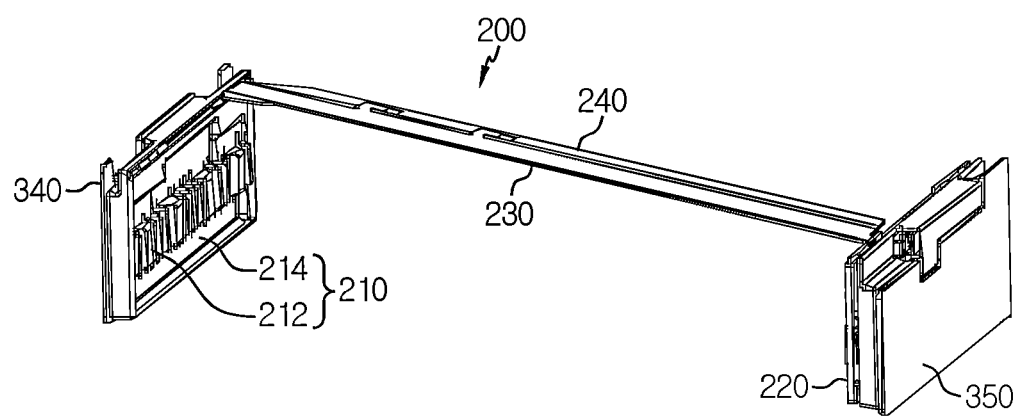
FIG. 3 is a perspective view of a sensing assembly included in the battery module of FIG. 1.
Figure 4:
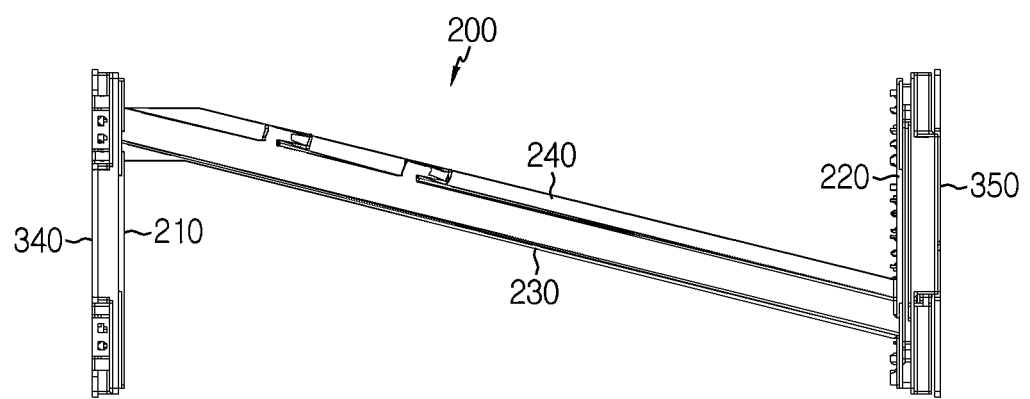
FIG. 4 is a top view of the sensing assembly of FIG. 3.

FIG. 3 is a perspective view of the sensing assembly included in the battery module of FIG. 1, FIG. 4 is a top view of the sensing assembly of FIG. 3, and FIGS. 5a to 5c are enlarged perspective views showing the structure in which the top cover is coupled to the first busbar frame assembly in the sensing assembly of FIG. 3.

Further referring to FIGS. 3 and 4, as described previously, the sensing assembly 200 includes the first busbar frame assembly 210, the second busbar frame assembly 220, and the sensing wire 230. The sensing wire 230 connects the first busbar frame assembly 210 and the second busbar frame assembly 220. The sensing wire 230 may be provided as a flexible printed circuit board (FPCB). The FPCB includes printed circuits on a board of an electrical insulating material, and extends elongatedly in a rectangular strip shape. In this case, the sensing assembly 200 may further include a top cover 240 that covers the flexible printed circuit board.

The first busbar frame assembly 210 may be positioned in front of the battery cell assembly 100, and may be coupled with the front cover 340. The first busbar frame assembly 210 may be electrically connected to the electrode leads 120 of the battery cells 110 of the battery cell assembly 100. To this end, the first busbar frame assembly 210 is equipped with a plurality of busbars 212 electrically contacting and connected to the electrode leads 120 of the battery cells 110, and includes a frame 214 that supports the busbars 212 and includes an external connector or an input/output terminal. The frame 214 may be made of reinforced plastic having electrical insulation and impact resistance.

The second busbar frame assembly 220 and the first busbar frame assembly 210 may be positioned facing each other with the battery cell assembly 100 interposed between, and the second busbar frame assembly 220 may be coupled with the rear cover 350 at the rear of the battery cell assembly 100. The second busbar frame assembly 220 may be electrically connected to the electrode leads 120 of the battery cells 110 of the battery cell assembly 100. To this end, the second busbar frame assembly 220 is equipped with a plurality of busbars 222 electrically contacting and connected to the electrode leads 120 of the battery cells 110, and includes a frame 224 that supports the busbars 222, and includes an external connector or an input/output terminal.

The frame 224 may be made of reinforced plastic having electrical insulation and impact resistance.

The frames 214, 224 may serve as an isolation plate that covers at least parts of the busbars 212, 222 to electrically isolate at least parts of the busbars 212, 222. A BMS electrically connected to the sensing assembly 200 may be further included on the frames 214, 224.

The sensing wire 230 runs across the upper side of the battery cell assembly 100 in a diagonal direction. Accordingly, the sensing wire 230 is placed on the upper side of all the battery cells 110 that form the battery cell assembly 100. Because the sensing wire 230 is not positioned at a certain place, the thermally conductive adhesive 400 formed on two sides of the sensing wire 230 may be uniformly formed over all the battery cells 110. It will be described with reference to FIGS. 6 to 8 below.

Figure 5A:
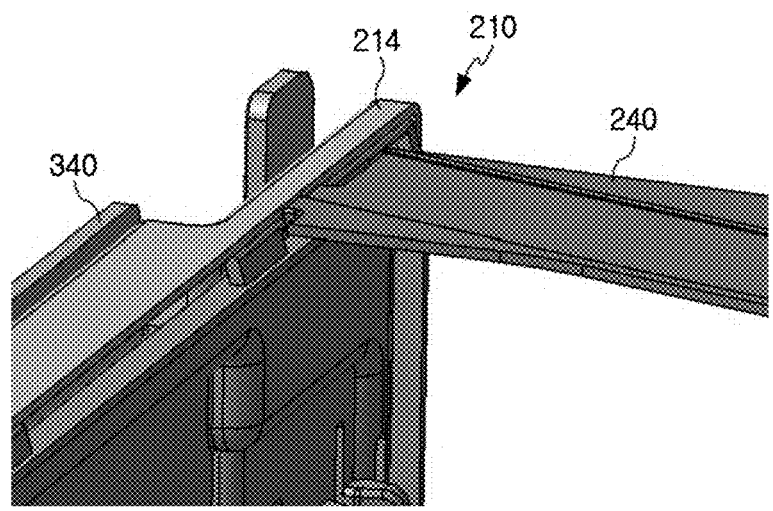
FIGS. 5a to 5c are enlarged perspective views showing a structure in which a top cover is coupled to a first busbar frame assembly in the sensing assembly of FIG. 3.
Figure 5B:
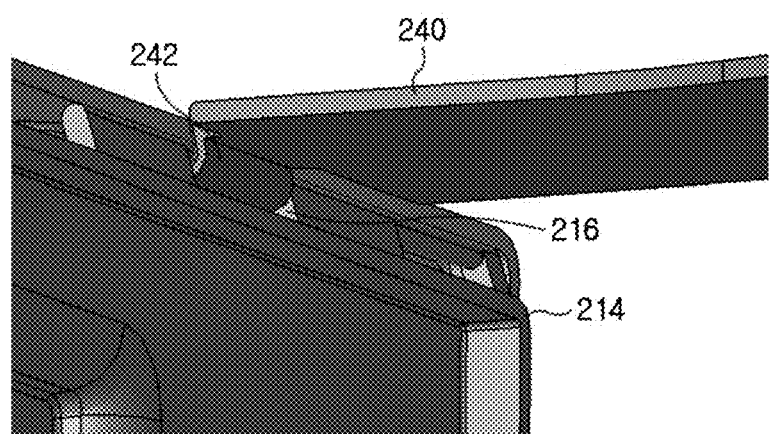
Figure 5C:
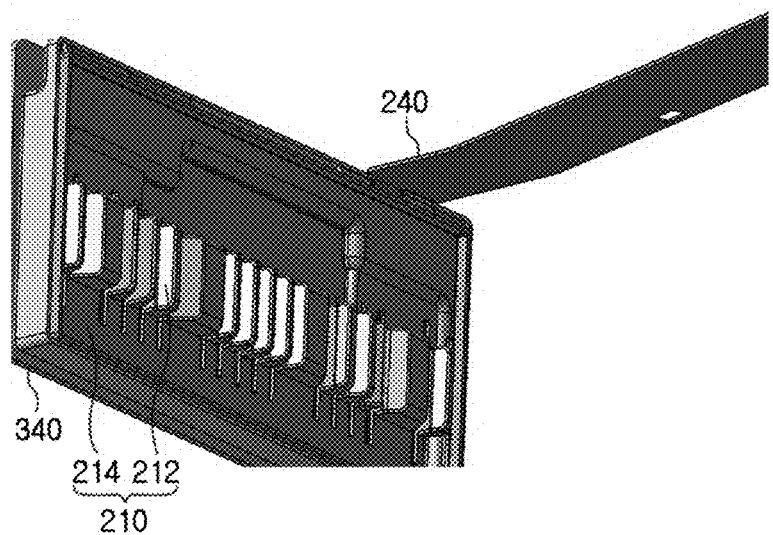

FIGS. 5a to 5c show the coupling relationship between the top cover 240 and the first busbar frame assembly 210 in detail.

A faulty operation of the sensing wire during assembly directly impacts related, and when the coating is torn, the sensing wire is no longer insulated or a short may occur. Accordingly, the top cover 240 is applied as a packaging structure that protects the sensing wire 230. Additionally, the sensing wire 230 such as FPCB is not rigid, and may be difficult to use and confine. Thus, the top cover 240 of a plastic injection molding material such as PI is applied to ensure rigidity of the sensing wire 230.

Referring to FIGS. 5a to 5c, the top cover 240 has a hook 242 at two ends, and the first busbar frame assembly 210, in particular the frame 214, has fixing holes 216 for insertion of the hooks. When the hooks 242 are coupled to the fixing holes 216, the top cover 240 and the first busbar frame assembly 210 are coupled together. The same coupling relationship exists between the top cover 240 and the second busbar frame assembly 220. The coupling structure between the hooks 242 and the fixing holes 216 is easy to couple and decouple, and it also serves as a sort of hinge, thereby fully providing a process margin in the operation.

Figure 6:
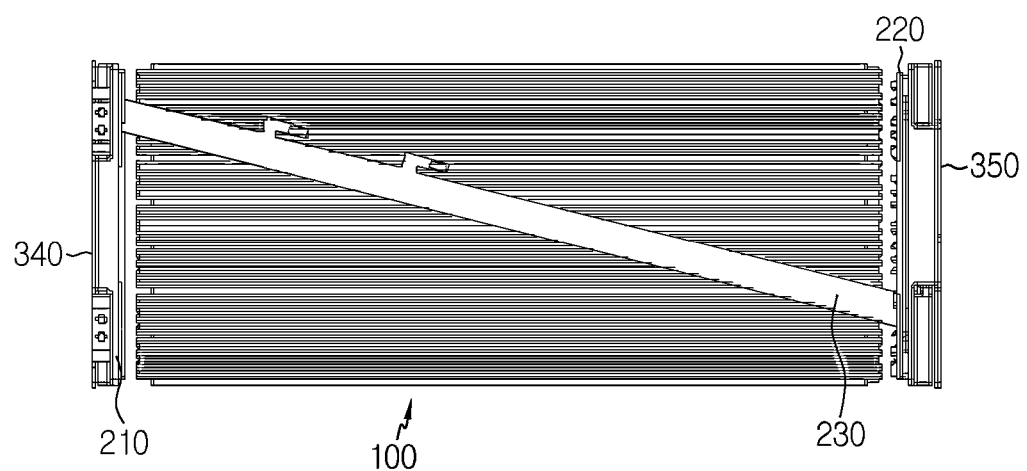
FIG. 6 is a top view of the battery module of FIG. 1 before a top cover of a sensing assembly is coupled thereto.
Figure 7:
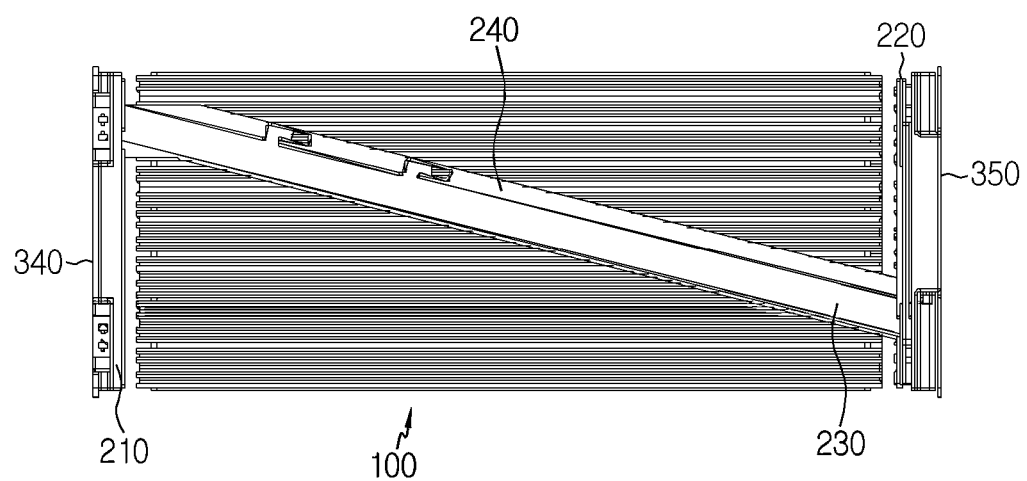
FIG. 7 is a top view of the battery module of FIG. 1 after a top cover of a sensing assembly is coupled to it.
Figure 8:
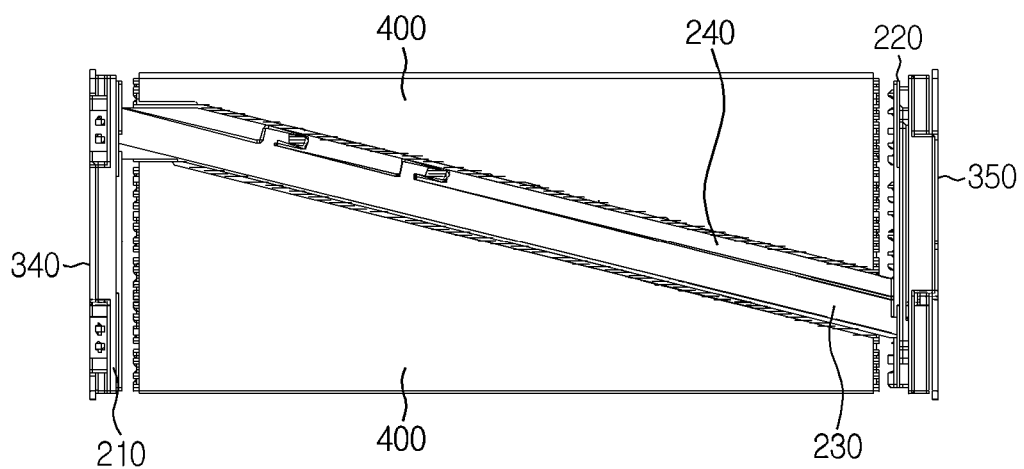
FIG. 8 is a top view of the battery module of FIG. 1 after a thermally conductive adhesive is applied to the upper side of the battery cell assembly.

The battery module 10 of the present disclosure is characterized in that the thermally conductive adhesive 400 can be formed on the upper side of the battery cell assembly 100, due to a change in the sensing assembly 200. The sensing assembly 200 features the sensing wire 230 positioned across the upper side of the battery cell assembly 100 in a diagonal direction. Referring to FIGS. 6 to 8, the unique markedly superior effect of this placement will be described.

FIG. 6 is a top view of the battery module of FIG. 1 before the top cover of the sensing assembly is coupled thereto; FIG. 7 is a top view of the battery module of FIG. 1 after the top cover of the sensing assembly is coupled to it; and FIG. 8 is a top view of the battery module of FIG. 1 after the thermally conductive adhesive is applied to the upper side of the battery cell assembly.

First, referring to FIG. 6, as described previously, the sensing wire 230 connecting the first busbar frame assembly 210 and the second busbar frame assembly 220 is placed across the upper side of the battery cell assembly 100 in a diagonal direction. The sensing wire 230 is not positioned at a certain place with respect to the battery cells 110 that form the battery cell assembly 100, and it runs all over the upper side of the battery cell assembly 100. Most preferably, the sensing wire 230 runs over all the battery cells 110, or is positioned in perfect symmetry with respect to the sensing wire 230. From the perspective of the battery cell assembly 100, the battery cells 110 that form the battery cell assembly 100 are placed in almost similar environments. The environment in which each battery cell is placed does not change depending on the position of the battery cells, such as the case in which the sensing wire runs over some battery cells but does not run over some other battery cells. Accordingly, it is possible to use the battery cells 110 that form the battery cell assembly 100 while maintaining their properties.

Referring to FIG. 7, the top cover 240 covers the sensing wire 230. As the top cover 240 is a packaging structure that protects the sensing wire 230, the top cover 240 is placed across the upper surface of the battery cell assembly 100 in a diagonal direction along the placement of the sensing wire 230.

Subsequently, referring to FIG. 8, the thermally conductive adhesive 400 is formed on two sides of the sensing wire 230. The sensing wire 230 and the top cover 240 protrude from the upper surface of the battery cell assembly 100. When the module case 300 is designed such that the upper surface of the top cover 240 and the lower surface of the upper side of the module case 300 fit together, an empty space between the upper surface of the battery cell assembly 100 and the lower surface of the upper side of the module case 300 is formed around an area other than the area where the sensing wire 230 and the top cover 240 are formed, and the thermally conductive adhesive 400 occupies that empty space.

As the sensing wire 230 is placed across the upper side of the battery cell assembly 100 in a diagonal direction, the thermally conductive adhesive 400 formed on two sides of the sensing wire 230 may be uniformly formed on the upper side of all the battery cells 110 that form the battery cell assembly 100. Accordingly, there is no risk that only some battery cells 110 are cooled due to the thermally conductive adhesive 400 positioned at a certain place.

In the conventional battery module, a location to which the thermally conductive adhesive may be applied is only limited to the inner surface of the bottom of the module case or the upper side of the cooling plate. Because a separate component such as a voltage sensing line is disposed on the upper side of the battery cell assembly, it is difficult to uniformly apply the thermally conductive adhesive over the battery cell assembly around this component. In the present disclosure, as the sensing wire 230 is diagonally positioned, it is possible to uniformly apply the thermally conductive adhesive 400 over the entire battery cell assembly 100 around the sensing wire 230. Accordingly, the present disclosure can address the case in which lower side cooling as well as upper side cooling is needed, and it can solve the battery cell heat generation problem by cooling through the upper side of the battery cell assembly. Besides, it is possible to uniformly remove heat from all the battery cells that form the battery cell assembly through the thermally conductive adhesive 400, and there is no likelihood that heat is not fully removed from all the battery cells and only some battery cells degrade fast.

There was no earlier attempt to apply the thermally conductive adhesive to the upper side of the battery cell assembly due to the structure of the battery cell assembly, but the present disclosure makes it possible by changing the structure of the sensing assembly included in the battery cell assembly, and thus may improve the cooling performance and firmly fix the battery cell, and this is not a matter of simple design modification.

Figure 9:
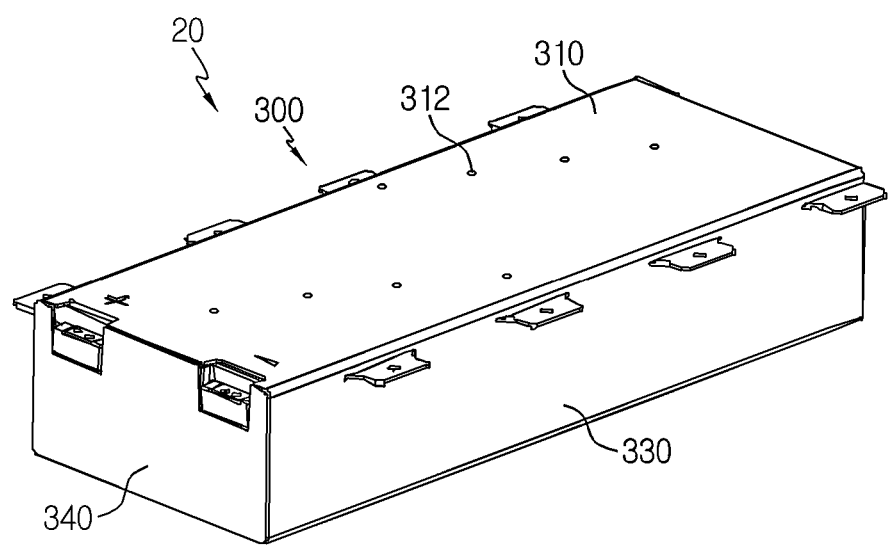
FIG. 9 is a perspective view illustrating a battery module according to another embodiment of the present disclosure.
Figure 10:
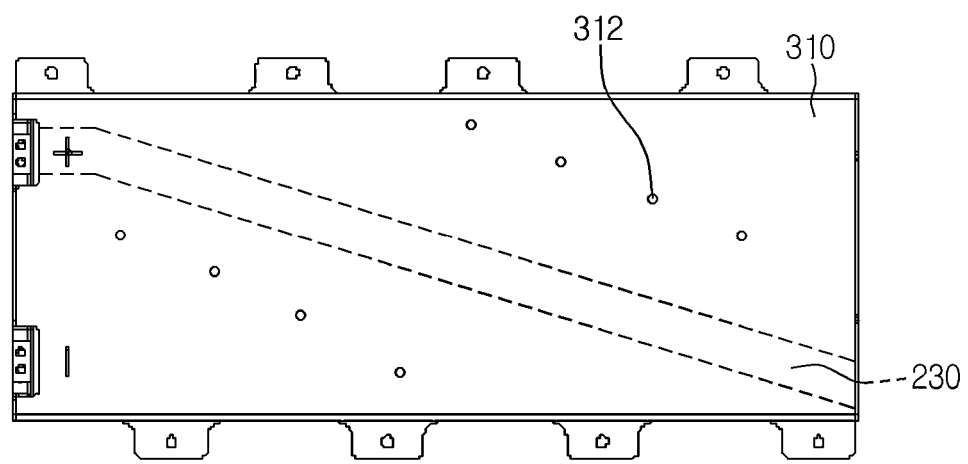
FIG. 10 is a top view of the battery module of FIG. 9.
Figure 11:
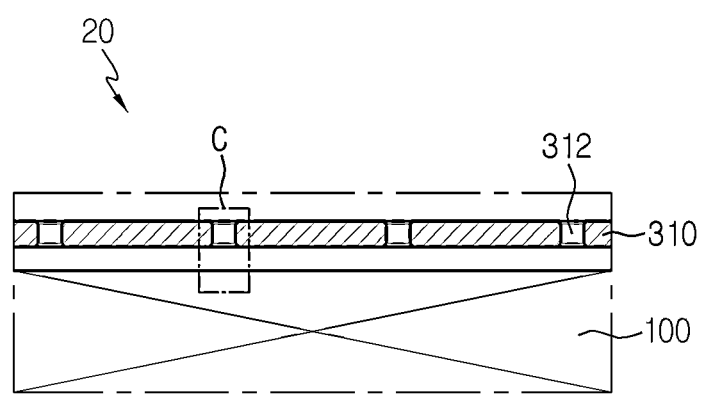
FIG. 11 is a cross-sectional view of main parts illustrating injection holes of the battery module of FIG. 9.
Figure 12:
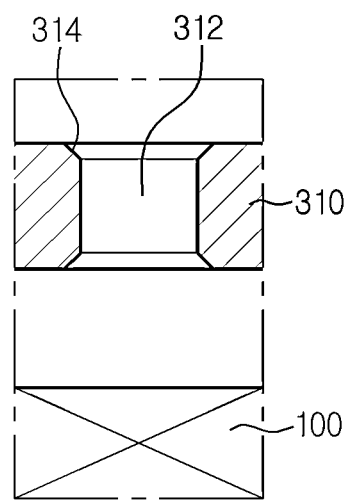
FIG. 12 is an enlarged diagram of section C in FIG. 11.

FIG. 9 is a perspective view illustrating a battery module according to another embodiment of the present disclosure, and FIG. 10 is a top view of the battery module of FIG. 9. FIG. 11 is a cross-sectional view of the main parts illustrating injection holes of the battery module of FIG. 9, and FIG. 12 is an enlarged diagram of section C in FIG. 11.

The battery module 20 according to this embodiment is substantially the same as or similar to the battery module 10 of the previous embodiment, and with regard to the same or similar configuration, redundant descriptions are omitted herein, and hereinafter difference(s) between this embodiment and the previous embodiment will be primarily described.

The battery module 20 has injection holes 312 on the module case 300, i.e., in the top plate 310, to inject the thermally conductive adhesive into the module case 300. The injection holes 312 are included on two sides of an area corresponding to the sensing wire 230.

In the assembly process, the battery cell assembly (see 100 of FIG. 1) is received in the module case 300, and the front cover 340 and the rear cover 350 are coupled thereto. Subsequently, before the thermally conductive adhesive injection, an operator may place the module case 300 horizontally.

Subsequently, to apply the thermally conductive adhesive into the module case 300, the operator may insert an injection nozzle into the injection holes 312 provided on the module case 300 and inject the thermally conductive adhesive into the module case 300. Through this, the thermally conductive adhesive 400 may be formed on two sides of the sensing wire 230 on the upper side of the battery cell assembly 100.

Because before the injection, the module case 300 is positioned horizontally and the thermally conductive adhesive is injected in a direction perpendicular to the ground, the thermally conductive adhesive may be uniformly distributed in the module case 300.

Particularly, a plurality of injection holes 312 may be provided along a direction that forms an angle 0 to 30° with a direction in which the sensing wire 230 runs. The injection holes 312 provided along the direction that forms an angle of 0 with the direction in which the sensing wire 230 runs represents the injection holes 312 being formed in parallel with the sensing wire 230. This angle may be adjusted to uniformly apply the thermally conductive adhesive into the module case 300.

The injection holes 312 may be spaced apart a predetermined distance from each other. The interval may be adjusted such that the interval is equal or gradually changes to uniformly apply the thermally conductive adhesive into the module case 300.

A sloped chamfer 314 may be provided at one side of the plurality of injection holes 312—to be exact: the end exposed out of the top plate 310 on the module case 300. The chamfer 314 may guide the positioning of the injection nozzle into the injection holes 312 for injection of the thermally conductive adhesive, and it may increase the contact area with the injection nozzle, thereby improving sealability when mounting the injection nozzle.

Hereinafter, simulation experiment results of the cooling performance of the battery module according to the present disclosure will be described.

Figure 13:
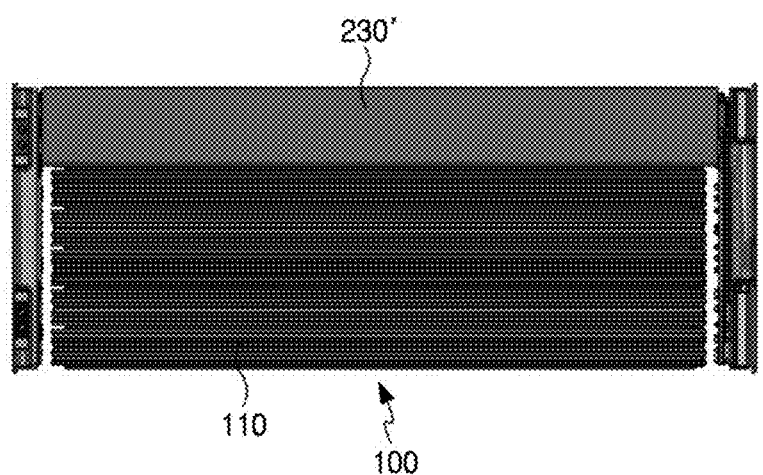
FIG. 13 is a top view of a comparative example battery module.
Figure 14:
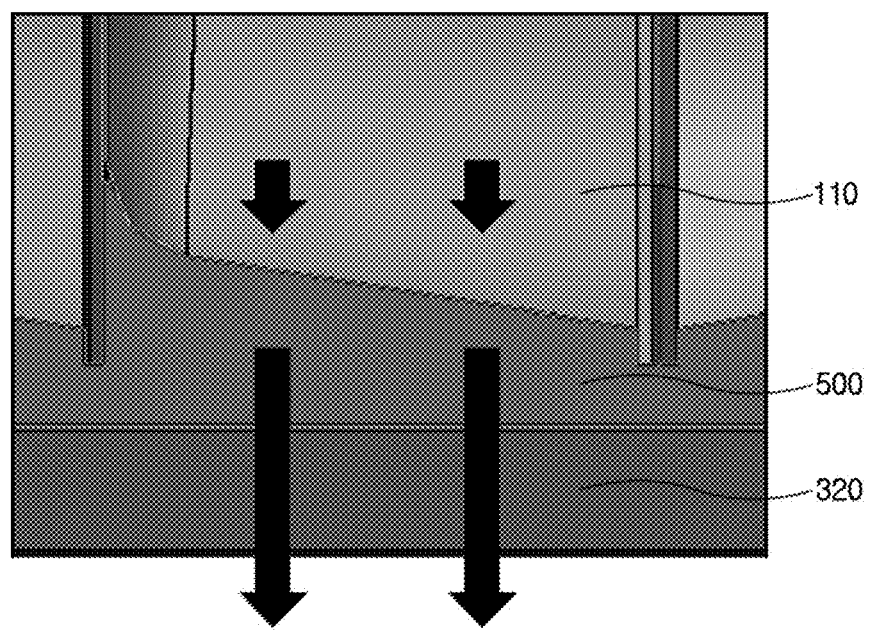
FIG. 14 is a cross-sectional view showing lower side cooling structure of the battery module of FIG. 13.

FIG. 13 is a top view of a comparative example battery module, and FIG. 14 is a cross-sectional view showing the lower side cooling structure of the battery module of FIG. 13.

The battery module of FIG. 13 is a structure that was assumed by the inventor to compare with the present disclosure. Referring to FIG. 13, to compare with the present disclosure, the sensing wire 230' is positioned at a certain location with respect to the battery cell assembly 100, and the thermally conductive adhesive is not included on the upper side of the battery cell assembly 100. A thermally conductive adhesive 500 having a thermal conductivity of 3 W/mK is applied to the lower side of the battery cell assembly 100, the module case 300 is made of Al, and a heat transfer path from the battery cell assembly—100 to the thermally conductive adhesive—500 to the bottom plate 320 is formed. Because the sensing wire 230' is only positioned at a certain location, it is impossible to apply the thermally conductive adhesive to the upper side of the battery cell assembly 100, and only lower side cooling is possible. Simulation is performed such that the thermal resistance from the upper end of the battery cells 110 to the lower end of the module case 300, i.e., the bottom plate 320 is about 1.4K/W.

Figure 15:
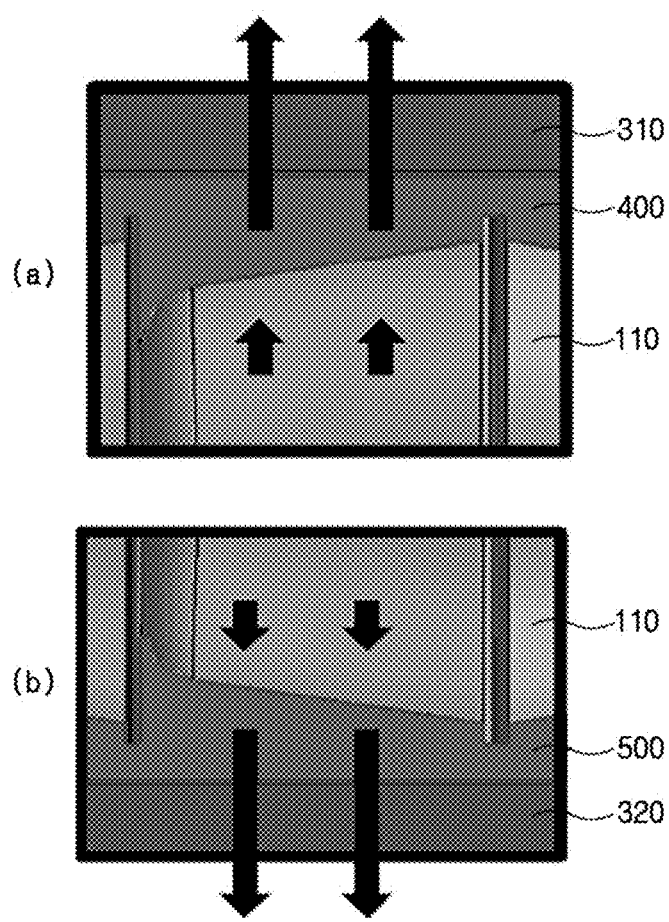
FIG. 15 is a cross-sectional view showing upper side and lower side cooling structures of an experimental battery module of the present disclosure.

FIG. 15 is a cross-sectional view showing the upper side and lower side cooling structures of an experimental battery module of the present disclosure.

FIG. 15 corresponds to the battery module 10 according to an embodiment. As described previously, the sensing wire 230 is positioned in a diagonal direction across the battery cell assembly 100, and the thermally conductive adhesive 400 having a thermal conductivity of 3 W/mK is also uniformly included on the upper side of the battery cell assembly 100. The thermally conductive adhesive 500 having the thermal conductivity of 3 W/mK is also applied to the lower side of the battery cell assembly 100, and the module case 300 is made of Al. Accordingly, in the experimental example of the present disclosure, a heat transfer path from the battery cell assembly—100 to the thermally conductive adhesive—400 to the top plate 310, as shown in (a) of FIG. 15, as well as a heat transfer path from the battery cell assembly—100 to the thermally conductive adhesive—500 to the bottom plate 320, as shown in (b), may be formed. In the case of the experimental example of the present disclosure, cooling through both the upper side and lower side of the battery cell assembly is possible. Particularly, in the case of upper side cooling, except for a local thermal performance loss at an area in which the top cover 240 of the sensing assembly 200 is disposed, simulation is performed such that the thermal resistance from the upper end of the battery cells 110 to the upper end of the module case 300, i.e., the top plate 310, is about 0.8K/W, which is much lower than the thermal resistance of comparative example, and accordingly, it can be seen that the cooling performance is much better. Additionally, in the same way as comparative example, because lower side cooling is added, when considering this, it can be seen that the overall thermal resistance will be further reduced to 0.8K/W or less.

Figure 16:
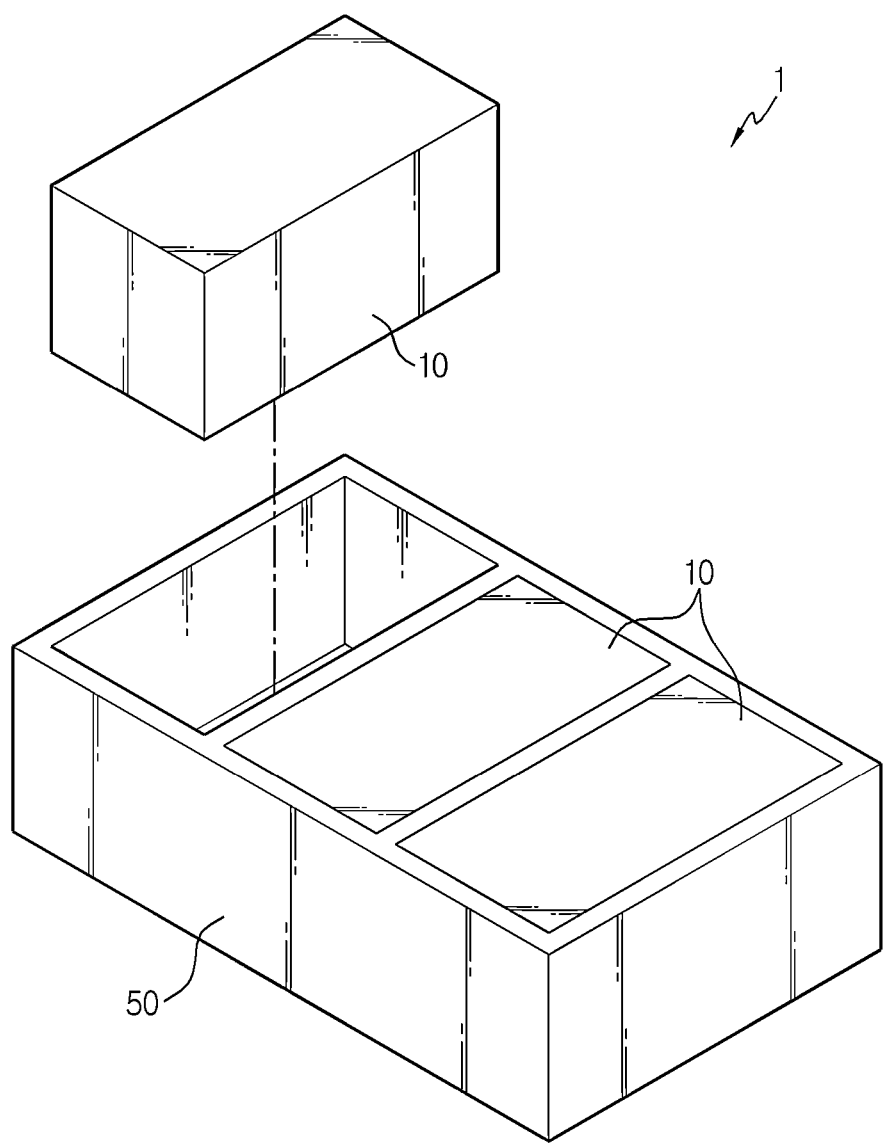
FIG. 16 is a diagram illustrating a battery pack according to an embodiment of the present disclosure.

FIG. 16 is a diagram illustrating the battery pack according to an embodiment of the present disclosure.

Referring to FIG. 16, the battery pack 1 may include at least one battery module 10 according to the previous embodiment and a pack case 50 to package the at least one battery module 10.

Here, the at least one battery module may be provided as the battery module 20 of the previous embodiment. Additionally, it is obvious that the battery module may be provided as an assembly of the battery module 10 and the battery module 20 of the previous embodiment. Additionally, in addition to the battery module 10 and the pack case 50, the battery pack 1 according to the present disclosure may further include various types of devices for controlling the charge/discharge of the battery module 10, for example, a BMS, a current sensor and a fuse.

The battery pack 1 may be provided in a vehicle as a fuel source of the vehicle. For example, the battery pack 1 may be provided in an electric vehicle, a hybrid electric vehicle and other applications using the battery pack 1 as a fuel source.

Additionally, it is obvious that the battery pack 1 may be provided in any other device, apparatus and equipment other than a vehicle, such as an Energy Storage System using a secondary battery.

The battery pack 1 according to this embodiment, and the device, apparatus and equipment including the battery pack 1, such as a vehicle, include the above-described battery module 10. Thus it is possible to implement the battery pack 1 having all advantages of the above-described battery module 10, as well as the device, apparatus and equipment, such as a vehicle, including the battery pack 1.

According to various embodiments as described above, it is possible to provide the battery module 10, 20 with a larger volume of battery cells 110 and a more compact size, as well as a battery pack 1 including the battery module 10, 20 and a vehicle including the battery pack 1.

Meanwhile, the terms indicating directions as used herein, such as upper, lower, front and rear, are used for convenience of description only, and it is obvious to those skilled in the art that the term may change depending on the position of the stated element or an observer.

While the present disclosure has been hereinabove described with regard to a limited number of embodiments and drawings, the present disclosure is not limited thereto, and it is obvious to those skilled in the art that various modifications and changes may be made thereto within the technical aspects of the present disclosure and the equivalent scope of the appended claims.

The invention claimed is:

1. A battery module comprising:
 a battery cell assembly including a stack of a plurality of battery cells;
 a module case which receives the battery cell assembly therein;
 an electrical wire extending along an outer side of the battery cell assembly and positioned between the outer side of the battery cell assembly and an opposing inner surface of the module case; and
 a thermally conductive adhesive interposed between the outer side of the battery cell assembly and the opposing inner surface of the module case, the thermally conductive adhesive extending over an enclosed region of the outer side of the battery cell assembly,
 wherein the electrical wire extends across the enclosed region of the outer surface of the battery cell assembly so as to separate the enclosed region into a first covered subregion and a second covered subregion on respective opposing sides of the electrical wire, wherein the thermally conductive adhesive covers the first covered subregion and the second covered subregion without extending over the electrical wire, such that a noncovered subregion in which the thermally conductive adhesive is not present is defined between the first and second covered subregions, the noncovered subregion forming a narrow strip elongated along the electrical wire,
 wherein the first covered subregion, the second covered subregion, and the noncovered subregion collectively define the enclosed region, and wherein the first and second covered subregions together occupy a majority of the area of the enclosed region, such that the thermally conductive adhesive is uniformly distributed over all of the plurality of battery cells of the battery cell assembly except for the narrow strip of the noncovered subregion.

2. The battery module according to claim 1, wherein the electrical wire is a sensing wire for sensing voltage or temperature of the battery cell assembly.

3. The battery module according to claim 1, wherein the electrical wire extends between and connects a first busbar frame assembly positioned at a first end of the battery cell assembly and a second busbar frame assembly positioned at a second end of the battery cell assembly, the second end being opposite to the first end, and wherein the electrical wire extends from the first end to the second end of the battery cell assembly.

4. The battery module according to claim 3, wherein the electrical wire extends along a direction oriented obliquely to an axis extending between the first and second ends of the battery cell assembly.

5. The battery module according to claim 1, wherein the battery cell assembly defines an axis extending between a first end and an opposing second end of the battery cell assembly, wherein each of the plurality of battery cells of the battery cell assembly has a first electrode lead protruding therefrom at the first end and a second electrode lead protruding therefrom at the second end, the first and second electrode leads having opposite polarity to one another.

6. The battery module according to claim 5, wherein the electrical wire extends along a direction oriented obliquely to the axis.

7. The battery module according to claim 1, wherein the battery cell assembly has a longitudinal axis, the electrical wire extending along a direction oriented obliquely to the longitudinal axis.

8. The battery module of claim 1, wherein the plurality of battery cells in the stack are stacked along a stacking axis, the electrical wire extending along a direction oriented obliquely to the stacking axis.

9. The battery module according to claim 1, wherein the module case further includes:
 a top plate covering an upper side of the battery cell assembly;
 a bottom plate positioned facing the top plate and covering a lower side of the battery cell assembly;
 a pair of side plates coupled to the top and bottom plates and positioned on respective opposing sides of the battery cell assembly, such that the module case defines a first opening and a second opening at a front and a rear of the battery cell assembly, respectively; and
 a front cover and a rear cover, the front cover covering the front of the battery cell assembly at the first opening, and the rear cover covering the rear of the battery cell assembly at the second opening.

10. The battery module according to claim 9, wherein the outer side of the battery cell assembly along which the electrical wire extends and over which the thermally conductive adhesive extends is the upper side of the battery cell assembly.

11. The battery module according to claim 10, further comprising:
 a second region of the thermally conductive adhesive interposed the lower side of the battery cell assembly and a lower inner surface of the module case.

12. The battery module according to claim 1, wherein the electrical wire is provided as a flexible printed circuit board (FPCB).

13. The battery module according to claim 12, further comprising:
a top cover which covers the flexible printed circuit board.

14. The battery module according to claim 13, wherein the top cover has a first hook and a second hook at opposing first and second ends of the top cover, wherein a first busbar frame assembly positioned at a first end of the battery cell assembly has a first fixing hole for receiving the first hook, and wherein a second busbar frame assembly positioned at a second end of the battery cell assembly has a second fixing hole for receiving the second hook, the first and second hooks being coupled to the respective first and second fixing holes.

15. The battery module according to claim 1, further comprising:
a plurality of injection holes in the module case for injecting the thermally conductive adhesive into the module case, the injection holes being positioned over both the first area covered subregion and the second area covered subregion.

16. The battery module according to claim 15, wherein the plurality of injection holes include a plurality of first injection holes aligned along a first line and a plurality of second injection holes aligned along a second line, the first and second lines being parallel and extending along a direction which forms an angle of 0° to 30° with respect to a direction along which the electrical wire runs.

17. The battery module according to claim 15, wherein each of the injection holes includes a sloped chamfer at at least one end of the respective injection hole.

18. A battery pack comprising:
at least one battery module according to claim 1; and
a pack case which receives the at least one battery module therein.

19. A vehicle comprising at least one battery pack according to claim 18.

* * * * *